United States Patent
Ebbecke

(10) Patent No.: US 12,119,620 B2
(45) Date of Patent: Oct. 15, 2024

(54) EDGE EMITTING LASER DIODE AND METHOD FOR PRODUCING SAME

(71) Applicant: OSRAM Opto Semiconductors GmbH, Regensburg (DE)

(72) Inventor: Jens Ebbecke, Rohr in Niederbayern OT Helchenbach (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 534 days.

(21) Appl. No.: 17/430,658

(22) PCT Filed: Jan. 16, 2020

(86) PCT No.: PCT/EP2020/050989
§ 371 (c)(1),
(2) Date: Aug. 12, 2021

(87) PCT Pub. No.: WO2020/164845
PCT Pub. Date: Aug. 20, 2020

(65) Prior Publication Data
US 2022/0123529 A1    Apr. 21, 2022

(30) Foreign Application Priority Data
Feb. 15, 2019  (DE) .................... 10 2019 103 909.6

(51) Int. Cl.
*H01S 5/024* (2006.01)
*H01S 5/028* (2006.01)
*H01S 5/40* (2006.01)

(52) U.S. Cl.
CPC ........ *H01S 5/4043* (2013.01); *H01S 5/02461* (2013.01); *H01S 5/0282* (2013.01); *H01S 5/0287* (2013.01)

(58) Field of Classification Search
CPC .... H01S 5/3403; H01S 5/3201; H01S 5/3406; H01S 5/2036; H01S 5/02461;
(Continued)

(56) References Cited

U.S. PATENT DOCUMENTS 4,965,806 A    10/1990  Ashby et al.
9,722,394 B2 *  8/2017  Lauer .................. H01S 5/02469
(Continued)

FOREIGN PATENT DOCUMENTS

CN    103975490 A    8/2014
CN    108604773 A    9/2018
(Continued)

OTHER PUBLICATIONS

Properties of aluminum titanate (Al2TiO5) p. 1 (Year: 2024).*
(Continued)

*Primary Examiner* — Tod T Van Roy
*Assistant Examiner* — Delma R Forde
(74) *Attorney, Agent, or Firm* — MH2 Technology Law Group LLP

(57) ABSTRACT

The invention relates to an edge emitting laser diode comprising a semiconductor layer stack whose growth direction defines a vertical direction, and wherein the semiconductor layer stack comprises an active layer and a waveguide layer. A thermal stress element is arranged in at least indirect contact with the semiconductor layer stack, the thermal stress element being configured to generate a thermally induced mechanical stress in the waveguide layer that counteracts the formation of a thermal lens.

11 Claims, 3 Drawing Sheets

(58) Field of Classification Search
CPC .......... H01S 5/04254; H01S 5/04252; H01S 5/0607; H01S 5/024
See application file for complete search history.

(56) References Cited

U.S. PATENT DOCUMENTS

| | | | |
|---|---|---|---|
| 10,424,898 B2* | 9/2019 | Bachmann | ............ H01S 5/0282 |
| 2003/0179795 A1 | 9/2003 | Moriya et al. | |
| 2008/0205466 A1 | 8/2008 | Verma et al. | |
| 2010/0290496 A1 | 11/2010 | Takayama et al. | |
| 2017/0310081 A1 | 10/2017 | Lauer et al. | |
| 2017/0365982 A1* | 12/2017 | Bachmann | ............ H01S 5/2054 |
| 2018/0129013 A1* | 5/2018 | Balimann | .......... G02B 19/0014 |
| 2018/0331502 A1 | 11/2018 | Backmann et al. | |

FOREIGN PATENT DOCUMENTS

| | | |
|---|---|---|
| DE | 102011075502 A1 | 11/2012 |
| DE | 102011055891 A1 | 6/2013 |
| DE | 102015119226 A1 | 5/2017 |
| DE | 102011055891 B4 | 7/2017 |
| DE | 102017112242 A1 | 12/2017 |
| EP | 1906498 A1 | 4/2008 |
| JP | 2002329926 A | 11/2002 |
| JP | 2014170777 * | 9/2014 ............ H01L 33/00 |

OTHER PUBLICATIONS

Zirconium Tungstate, ATI, Technical Data Sheet, pp. 1-13, Jan. 12, 2012 (Year: 2012).*
International Search Report (with English Translation) and Written Opinion in corresponding International Application No. PCT/EP2020/050989 mailed on May 12, 2020, 15 pages.
Cohen et al., "Enhanced wavelength tuning of an InGaAsP—InP laser with a thermal-strain-magnifying trench", Applied Physics Letters, Oct. 23, 2000, vol. 77, No. 17, pp. 2629-2631.
Cohen, D.A., "Passive Temperature Compensation of Uncooled GaInAsP—InP Diode Lasers Using Thermal Stress" IEEE Journal of Selected Topics in Quantum Electronics, Apr. 1997, pp. 649-658, vol. 3, No. 2.
Chinese Office Action issued in corresponding Chinese Patent Application No. 202080013486.6, dated Jul. 10, 2024, with English language translation, 10 pages.

* cited by examiner

EDGE EMITTING LASER DIODE AND METHOD FOR PRODUCING SAME

CROSS-REFERENCE TO RELATED APPLICATIONS

This patent application is a national stage entry from International Application No. PCT/EP2020/050989, filed on Jan. 16, 2020, published as International Publication No. WO 2020/164845 A1 on Aug. 20, 2020, and claims priority to German application DE 10 2019 103 909.6, filed on Feb. 15, 2019, the disclosure content of all of which are hereby incorporated by reference.

FIELD OF THE INVENTION

The present invention relates to an edge emitting laser diode, in particular a broad area laser diode, and a manufacturing method for an edge emitting laser diode.

BACKGROUND OF THE INVENTION

Edge emitting laser diodes having a semiconductor layer stack comprising an active layer in which a laser radiation-generating active region is formed during operation are known. Seen in the direction of growth of the semiconductor layer stack, which will be referred to as the vertical direction in the following, waveguide layers of different conductivity type (n- or p-doping), whose refractive index is smaller than that of the active layer, are located above and below the active layer. The outer surfaces of the waveguide layers remote from the active layer are typically adjoined by cladding layers with an even lower refractive index. The optical resonator, in which the active region is located, is formed by a mirror facet and an exit facet of the active layer, which are located on the side surfaces in a longitudinal direction perpendicular to the vertical direction. In a lateral direction perpendicular to the vertical direction and to the longitudinal direction, the formation of the optical modes in the waveguide is determined by the known measures of a gain guidance or an index guidance.

For applications requiring a high output power, edge emitting laser diodes in the form of broad area diode lasers are suitable. These feature a large-area active layer that allows typical resonator lengths of up to 10 mm. Furthermore, a stripe-shaped aperture at the exit facet with a small vertical dimension, typically 1 µm, and a larger lateral dimension, typically 50 µm to 200 µm, is characteristic.

The radiation of broad area diode lasers in vertical direction is mostly characterized by a single-mode guidance and the resulting essentially diffraction-limited good beam quality at high divergence (FA: fast-axis). Due to the much larger lateral extension of the optical field in the active layer, a transverse radiation with smaller divergence (SA: slow-axis) results, which, however, has a much higher $M^2$ value compared to the vertical radiation. Due to the poorer beam quality of the transverse radiation, which is caused by higher-order modes in the lateral direction, the transverse focusability is impaired in the far field.

If edge emitting laser diodes, in particular broad area diode lasers, are operated with a high output power in continuous operation (cw), inhomogeneous heating of the waveguide must be taken into account, which leads to a temperature-dependent, locally varying refractive index for the compound semiconductors used. As a result, a so-called "thermal lens" is formed, i.e. a thermally induced waveguide whose optically effective lateral expansion extends to the region of a high refractive index gradient. When the thermal lens is pronounced enough, stabilization of higher order lateral modes occurs, reaching the laser threshold and further increasing the SA divergence of the far field. For broad area lasers, this degrades the beam quality for the transverse radiation.

From P. Crump et. al, "Experimental and theoretical analysis of the dominant lateral waveguiding mechanism in 975 nm high power broad area diode lasers," Semicond. Sci. Technol. 27 (2012), it is known that a thermal lens can be the dominant effect over gain guidance and index guidance in the formation of lateral modes in broad area diode lasers.

To influence the mode formation, DE 102011075502 A1 proposes to arrange an antiwaveguide layer laterally to the active region, the refractive index of which is sufficiently large that lateral upper modes are resonantly coupled in and attenuated without significantly affecting the lateral fundamental mode in the waveguide. Furthermore, EP 1906498 A1 mentions the formation of an absorber zone for attenuating higher modes, in which an oxide or nitride of Si, Ti, Al, Ga, Nb, Zr, Ta, Hf, Zn, Mg, Rh or In is incorporated.

U.S. Pat. No. 4,965,806 A describes various measures to prevent the formation of an optical lens in broad area laser diodes during high-power operation. In this context, additional heating elements connected to the current-carrying area can smooth the temperature profile. Furthermore, an upper waveguide with a layer thickness variation in the lateral direction and/or with embedded multilayers and/or with a doping variation is disclosed, which can be configured for a predetermined steady-state temperature profile in such a way that higher lateral modes are suppressed.

Furthermore, microstructured heat guides can be used to reduce the heating of the waveguide. For example, DE 102011055891 B4 proposes to apply a heat dissipating layer on top of the semiconductor layer stack, comprising at least the electrode layer and a heat sink. Furthermore, J. Piprek et. al, "Inverse Thermal Lens Effects on the Far-Field Blooming of Broad Area Laser Diodes," IEEE Photonics Techn. Letters, Vol. 25, (May 15, 2013) describes a submount for a broad area laser diode with lateral free regions that restrict heat flow to the substrate to the central region. The resulting increased temperature at the periphery of the waveguide leads to an inverse thermal lens.

A measure without a substantial intervention in the thermal system of the laser diode, which avoids strong refractive index gradients inside the waveguide despite an inhomogeneous temperature distribution, is described by DE 102015119226 A1. Disclosed is an epitaxially strained layer arranged above the active layer, which generates a stress-induced, local variation of the refractive index in lateral direction, which counteracts the thermally induced change of the refractive index in the waveguide. Described is an adapted compensation effect in longitudinal direction, which is effected by a continuous structuring of the layer thickness and/or the lateral extension of the strained layer in a lateral plane perpendicular to the vertical direction in combination with an arrangement centered above the active region, so that the temperature increasing in the direction of the exit facet can be taken into account during laser operation. Preferably, the strained layer is arranged within a metallization layer and comprises a dielectric, such as silicon nitride or silicon oxide, or a metal, such as Au or Ti.

A disadvantage of the epitaxially strained layer proposed by DE 102015119226 A1 is the need for adaptation to a predetermined operating point. Consequently, a high degree of compensation is achieved only for a certain inhomogeneous temperature distribution. Accordingly, during modulated high power operation of the laser diode, the effect of a thermal lens or overcompensation of the refractive index variation, which acts like a power-dependent index guidance, cannot be prevented.

Furthermore, it is known to adjust the residual stress in an epitaxially grown passivation layer to control the mechanical stress in the active region with the aim of preventing damage to the exit facet (COD) during laser operation. For example, US 20030179795 A1 describes a stress compensation layer of SiN on a passivation layer of silicon oxide. US 20080205466 A1 discloses a compressively preloaded passivation of SiO2 on the lateral surfaces of the mesa structure of a ridgelaser to compensate for the stress introduced by the electrode layer.

It is an object of the invention to provide an improved edge emitting laser diode, in particular with regard to the formation of a thermal lens.

The object is solved by the features of the edge emitting laser diode according to claim 1 and the manufacturing method according to claim 9. Advantageous embodiments result from the sub-claims.

SUMMARY OF THE INVENTION

The starting point of the invention is an edge emitting laser diode with a semiconductor layer stack comprising an active layer in which an active region for generating coherent electromagnetic radiation is formed during laser operation. The typically epitaxial manufacture of the semiconductor layer stack establishes a growth direction, hereinafter referred to as the vertical direction. With respect to this vertical direction, waveguide layers are arranged above and below the active layer, which have a higher refractive index than the active layer and which differ with respect to the conductivity type (n- or p-doping). In a longitudinal direction perpendicular to the vertical direction, a mirror facet and an exit facet form an optical resonator, which accommodates the active region. The guidance of the optical field within the waveguide layers is either gain-guided or index-guided.

According to the invention, for operation with a high output power and the associated inhomogeneous heating of the waveguide layers due to non-radiating recombination processes, a thermal stress element is arranged in the active region in at least indirect contact with the semiconductor layer stack, which causes a thermally induced mechanical stress in at least one waveguide layer. In this context, a thermal stress element is understood to be a component that generates a temperature-dependent mechanical stress due to a different thermal expansion coefficient $\alpha_{th}$ compared to the immediately adjacent layers. Furthermore, the thermal stress element is formed with regard to the arrangement, dimensioning and material selection in such a way that the formation of a thermal lens in the waveguide is at least partially compensated.

Compared to epitaxially strained structured layers, which can counteract the formation of a stationary thermal lens, the arrangement according to the invention with a thermal stress element allows an adaptation to different operating conditions and thus a modulated laser operation. According to the invention, mechanical stresses that locally change the refractive index in the waveguide occur as a function of the actual temperature distribution and can be used to compensate for time-varying thermally induced calculation index variations.

The mechanical stress generated by a thermal stress element depends, on the one hand, on the temperature and, on the other hand, on the difference in the thermal expansion coefficient $\alpha_{th}$ of the material pairing present. According to a first embodiment of the invention, the thermal expansion coefficient $\alpha_{th}$ of the thermal stress element is greater than that of the surrounding material. A thermal stress element designed in this way can be inserted above the active layer and centered on the active region, in particular in a contact layer or the regions of an electrode layer adjacent thereto. This results in a temperature-dependent lattice expansion in the waveguide.

For a second preferred embodiment of the invention, for which the thermal expansion coefficient $\alpha_{th}$ of the thermal stress element is smaller than that of the surrounding material, the thermal stress element is arranged with a lateral offset to the active region, since the thermally induced mechanical stress of the material pairing leads to a reduction of the lattice constant in the stressed region of the waveguide. This can cause a compensation of the effect of the thermal lens in the region of the greatest temperature gradients. Accordingly, for this material pairing, the thermal stress element is formed in the passivation layer or laterally to the semiconductor layer stack. Alternatively, the thermal stress element is formed by the passivation layer itself.

If III-V compound semiconductors, such as $Al_xGa_{1-x}As/GaAs$, In-GaP, InGaAsP, InGaAlP or II-VI compound semiconductors, such as zinc sulfide, cadmium telluride, are used for the semiconductor layer stack in combination with a silicon oxide- or silicon nitride-based passivation, it is preferred to use a material for the thermal stress element which has a thermal expansion coefficient $\alpha_{th}$ which is less than $0.5*10^{-6}$ K$^{-1}$ in a temperature range from 20° C. to 300° C. and particularly preferably less than $0.25*10^{-6}$ K$^{-1}$. In particular, a material with a negative thermal expansion coefficient $\alpha_{th}$ is advantageous. If materials with a non-isotropic coefficient of thermal expansion $\alpha_{th}$ are used, a spatially averaged value is to be applied for the above-mentioned preferred maximum values.

A preferred class of materials for the thermal expansion element with a negative coefficient of thermal expansion $\alpha_{th}$ is represented by oxide compounds of zirconium and tungsten. Particularly preferred is $ZrW_2O_8$, which has a coefficient of thermal expansion of $\alpha_{th}=-8.7\times10^{-6}$ K$^{-1}$ in a temperature range from $-273°$ C. to 770° C. In the manufacture of the edge nemitting laser diode according to the invention, the thermal stress element can be provided as an amorphous thin-film element from the starting materials $WO_3$ and $ZrO_2$ by sputtering or by coating with pulsed laser radiation, followed by annealing and structuring steps. Thereby, the temperature treatment during annealing influences the stoichiometry and the crystalline phases in order to adapt the thermal expansion coefficient $\alpha_{th}$ of the thermal stress element to the existing layer pairing.

Another preferred material for the thermal stress element contains aluminum titanate and/or zirconium titanate. Particularly advantageous is the resulting pseudo-ternary system $Al_2O_3$—$ZrO_2$—$TiO_2$, whose thermal expansion coefficient can be adjusted by weighting the main components. With 100 mol % aluminum titanate ($Al_2TiO_3$), the resulting coefficient of thermal expansion is $\alpha_{th}=-3.5\times10^{-6}$ K$^{-1}$, while 40 mol % $TiO_2$, 40 mol % $ZrO_2$ and 20 mol % $Al_2O_3$ results in a coefficient of thermal expansion of $\alpha_{th}=0.5\times10^{-6}$ K$^{-1}$. Thus, during the manufacture of the edge emitting laser diode according to the invention, the thermal expansion coefficient $\alpha_{th}$ of the thermal stress element can preferably be set with $\alpha_{th}<0.5\times10^{-6}$ K$^{-1}$ and particularly preferably with $\alpha_{th}<0.25\times10^{-6}$ K$^{-1}$ and in particular with a negative value.

Other preferred materials with a negative coefficient of thermal expansion $\alpha_{th}$ for manufacture of the thermal stress element represent $ZrMo_2O_8$, NiSi, $In_2Mo_3O_{12}$, $(HfMg)(WO_4)_3$ and graphene oxide.

For an advantageous embodiment of the invention, the edge emitting laser diode is a broad area laser diode particularly suitable for high output power applications. This has an optical resonator with a mirror facet and an exit facet which are widely spaced from one another in a longitudinal direction of several millimeters, the longitudinal direction forming an orthogonal tripod with the vertical direction and the lateral direction. For a further embodiment of the invention, the thermal stress element is adapted to a temperature increasing in the direction of the exit facet. Preferably, for this purpose, the thermal stress element is structured in such a way that its extension in the vertical direction and/or in the lateral direction increases in the course of its longitudinal extension towards the exit facet.

In one embodiment of the edge emitting laser diode with gain guidance according to the invention, the thermal stress element is formed in such a way that a compensation of a thermal lens succeeds to such an extent that the gain guidance is maintained as a dominant effect on the optical field in the lateral direction over the entire operating range. If an edge emitting laser diode with index guidance according to the invention is present, the thermal stress element is adapted in such a way that a change to a thermally induced waveguide is excluded even for the highest continuous operating power.

Furthermore, the thermal stress element provided according to the invention can be combined with further measures acting against the occurrence of a thermal lens, such as a microcooling device or epitaxially preloaded components in the semiconducting layer stack.

BRIEF DESCRIPTION OF THE DRAWINGS

In the following, exemplary embodiments of the invention are explained in connection with figure illustrations. These show, in each case schematically, the following.

DETAILED DESCRIPTION

Figure 1:
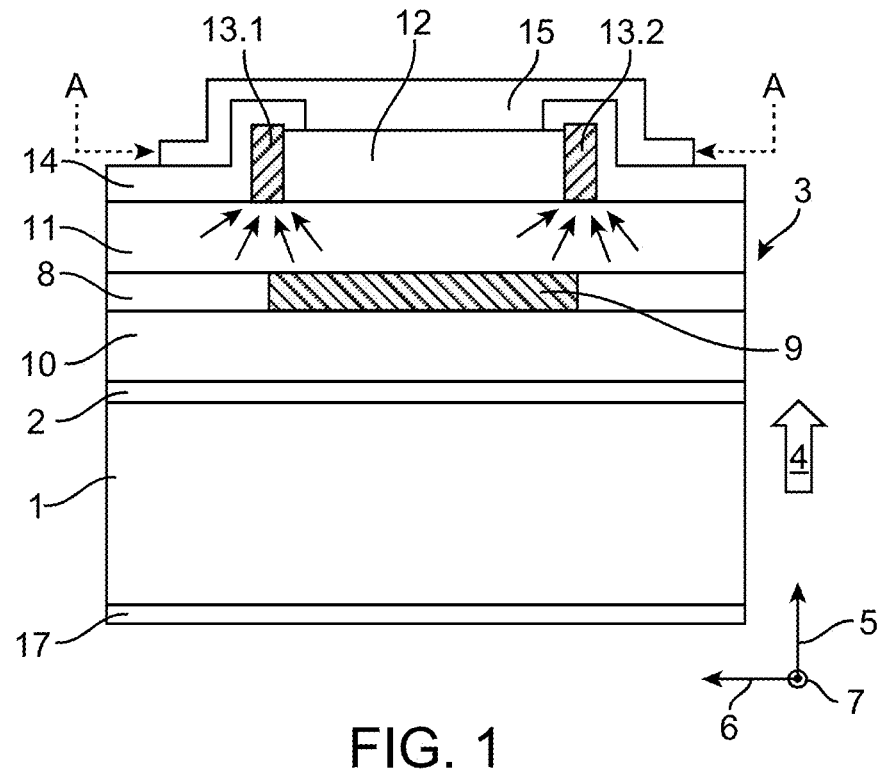
FIG. 1 shows a cross-sectional view of an edge emitting laser diode according to the invention.

FIG. 1 shows a schematically simplified and not to scale cross-sectional view of an edge emitting diode with gain guidance according to the invention. A carrier substrate 1 is shown, on which an intermediate layer 2 is applied. An epitaxially grown semiconductor layer stack 3 is built up on the intermediate layer 2, the growth direction 4 of which defines the vertical direction 5. The semiconductor layer stack 3 comprises an active layer 8, in which the active region 9 is formed during laser operation. With respect to the vertical direction 5, an n-doped waveguide layer 10 is arranged below the active layer 8 and a p-doped waveguide layer 11 is arranged above it, over which a contact layer 12 is applied. No further functional layers, such as cladding layers, are shown. A metallic electrode layer is used to provide the p-contact 15, and the n-contact 17 is arranged on the bottom surface of the carrier substrate 1.

According to the invention, a thermal stress element 13.1, 13.2, which is covered by a passivation layer 14, adjoins the contact layer 12 on both sides, i.e. in the lateral direction 6 perpendicular to the vertical direction 5. The temperature increase during laser operation leads to a temperature-dependent mechanical stress in the waveguide 10, 11 if the thermal expansion coefficient $\alpha_{th}$ of the thermal stress element 13.1, 13.2 differs from that of the adjacent layers. Accordingly, for the embodiment shown, the thermal expansion coefficient $\alpha_{th}$ of the contact layer 12, the waveguide layer 11, and the passivation layer 14 is considerable. For example, if $Al_xGa_{1-x}As/GaAs$ is used for the semiconductor layer stack 3, the thermal expansion coefficient of GaAs with $\alpha_{th}^{GaAs}=6*10^{-6}$ $K^{-1}$ (at 20° C.) and the thermal expansion coefficient of $Al_xGa_{1-x}As$ depending on the aluminum content with $\alpha_{th}^{AlxGa1-xAs}=(1.76-6)*10^{-6}$ $K^{-1}$ (at 20° C.) in the waveguide 10, 11 are to be used. Furthermore, the thermal expansion coefficient of the passivation layer 14, for example for SiN with $\alpha_{th}^{SiN}=4*10^{-6}$ $K^{-1}$ (at 20° C.) or for $SiO_2$ with $\alpha_{th}^{SiO2}=0.5*10^{-6}$ $K^{-1}$ (at 20° C.) is relevant.

Figure 2:
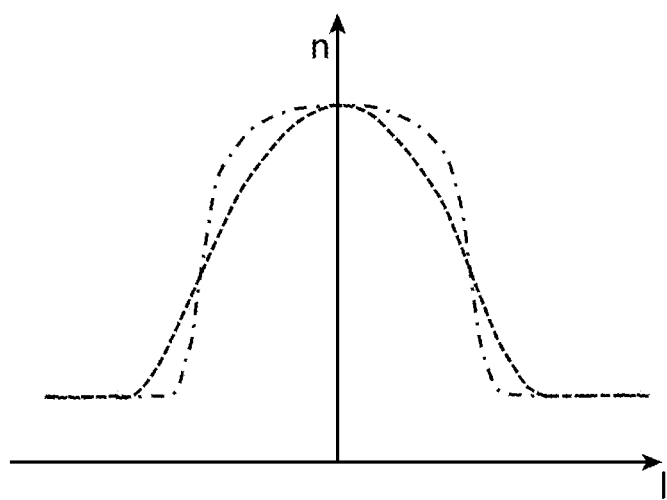
FIG. 2 shows a partial compensation of the refractive index curve during laser operation by a temperature-dependent mechanical stress in the waveguide.

In addition to the selection of the material pairing, its dimensioning and arrangement in the semiconductor layer stack 3 must be taken into account for the function of the thermal stress element 13.1, 13.2. According to the invention, the thermal stress element 13.1, 13.2 is configured to generate a thermally induced mechanical stress in the waveguide layer 10, 11, which counteracts the formation of a thermal lens. For the embodiment shown in FIG. 1, the arrangement of the thermal stress elements 13.1, 13.2 is chosen above the active layer and for the lateral direction off-center but symmetrically, with a projection in the vertical direction 5 hitting the edge region of the active region 9. This ensures that the thermally induced mechanical stress in the waveguide 10 acts in that region (illustrated by arrows in FIG. 1) for which the greatest gradient of the inhomogeneous temperature profile occurs during laser operation. If the thermal expansion coefficient of the thermal stress elements 13.1, 13.2 is chosen sufficiently smaller than that of the surrounding material and the material thickness of the thermal stress elements 13.1, 13.2 is dimensioned sufficiently large, a lattice-widening temperature-dependent mechanical stress is generated in the waveguide 10. As shown in FIG. 2, this results in a refractive index curve during laser operation which changes the slope relevant for guiding the lateral modes.

FIG. 2 shows the real part of the refractive index n in laser operation as a function of the lateral position 1 for an arrangement without the thermal stress elements 13.1, 13.2. The formation of a thermal lens between the areas of the largest refractive index gradients is evident, which lie in the region of the not shown highest temperature gradients. The dashed curve in FIG. 2 shows the refractive index curve of the arrangement according to the invention with the thermal stress elements 13.1, 13.2, whereby the gain guidance can be maintained by smoothing the refractive index curve.

For the arrangement of the thermal stress element 13.1, 13.2 shown in FIG. 1, in particular for combination with a silicon oxide-based passivation layer 14, a material is used for the thermal stress element 13.1, 13.2 which has a coefficient of thermal expansion $\alpha_{th}$, which in a temperature range from 20° C. to 300° C. is less than $0.5*10^{-6}$ $K^{-1}$ and particularly preferably less than $0.25*10^{-6}$ $K^{-1}$. Particularly advantageous materials with a negative coefficient of thermal expansion $\alpha_{th}$ are oxide compounds of zirconium and tungsten, in particular $ZrW_2O_8$, materials containing aluminum titanate and/or zirconium titanate, $ZrMo_2O_8$, NiSi, $In_2Mo_3O_{12}$, (HfMg)(WO$_4$)$_3$ or graphene oxide.

Figure 3:
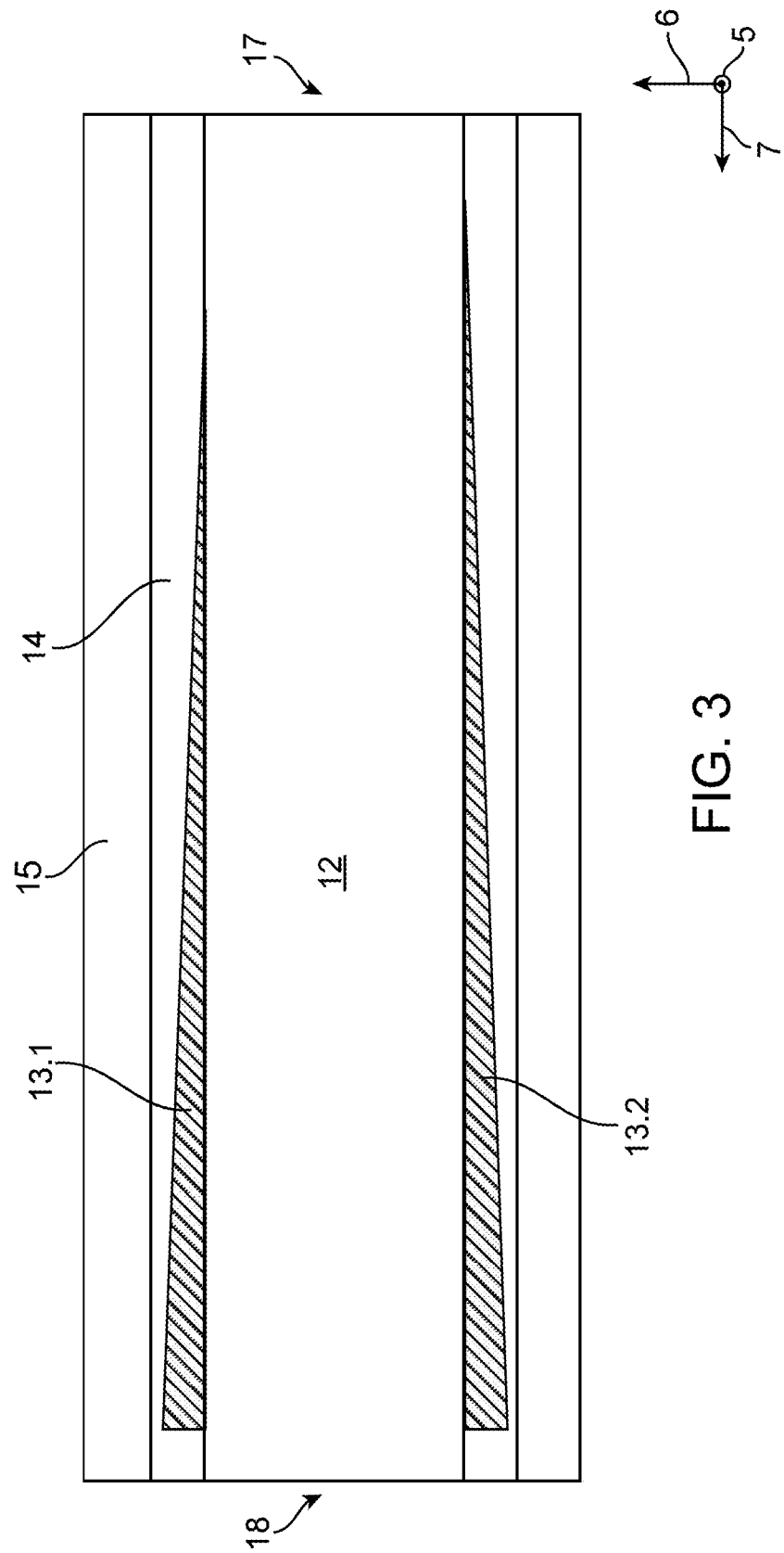
FIG. 3 shows the sectional view A-A for the edge emitting laser diode of FIG. 1 according to the invention.

FIG. 3 shows the section A-A from FIG. 1. The contact layer 12 and the electrode layer 15 are visible. The passivation layer 14 contains the thermal stress elements 13.1, 13.2, which have a wedge-shaped structure. This shape adapts to the temperature curve in the longitudinal direction 7, whereby the temperature increases from the mirror facet 17 in the direction of the exit facet 18. Accordingly, the structure is designed in such a way that the lateral extension of the thermal stress elements 13.1, 13.2 increases towards the exit facet 18. Furthermore, it can be seen that the longitudinal extension of the thermal stress elements 13.1, 13.2 is selected to be smaller than the resonator length in order to keep the regions of the semiconductor layer stack 3 immediately adjacent to the mirror facet 17 and the exit facet 18 as free as possible from mechanical stresses.

Figure 4:
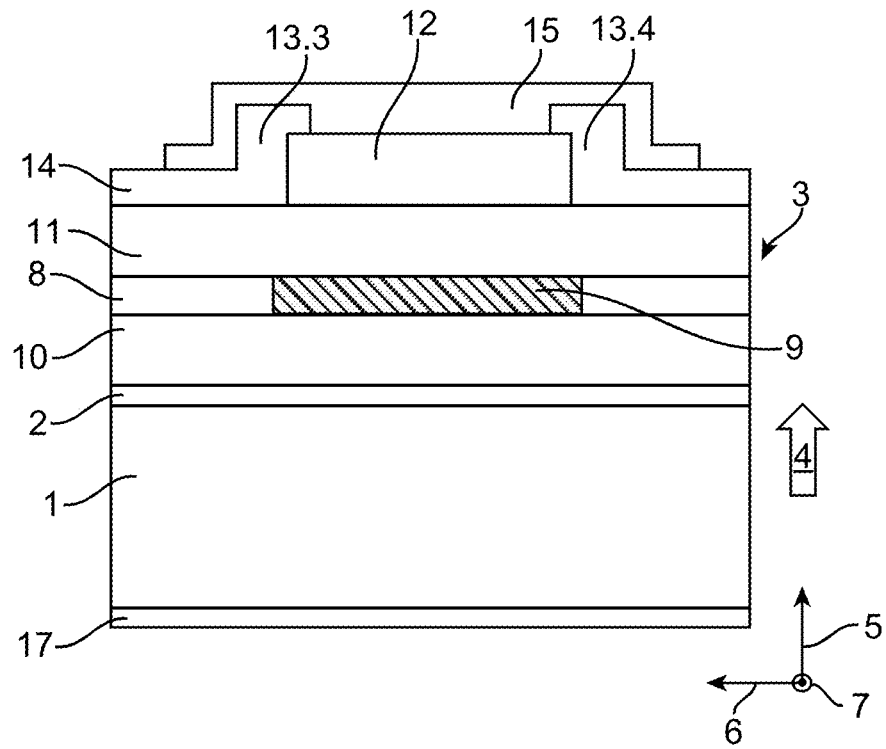
FIG. 4 shows a second embodiment of the edge emitting laser diode according to the invention in cross-sectional view.
Figure 5:
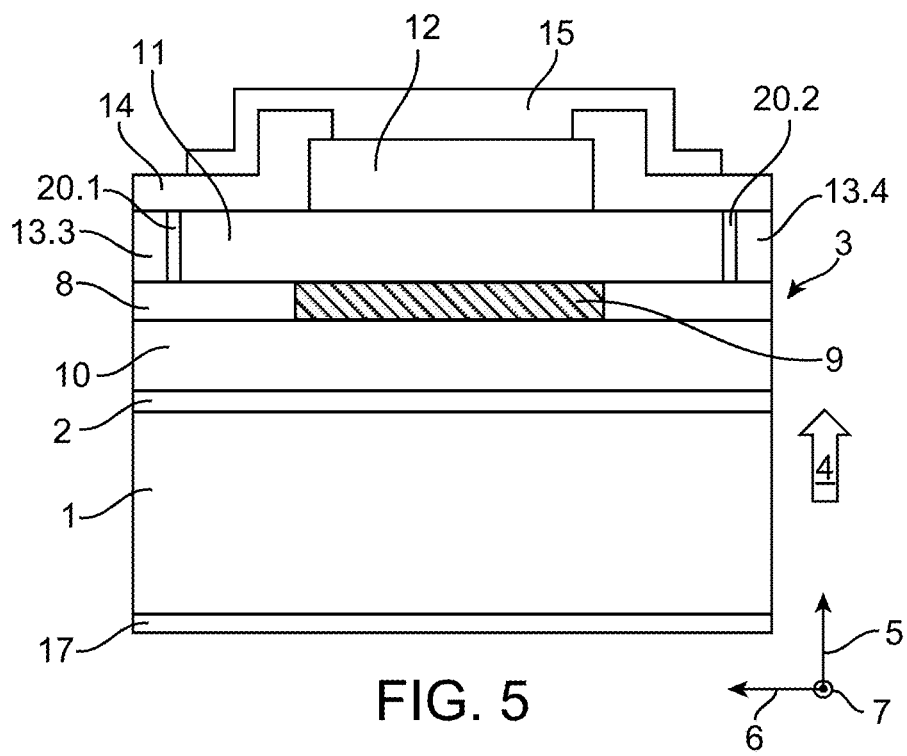
FIG. 5 shows a third embodiment of the edge emitting laser diode according to the invention in cross-sectional view.

FIGS. 4 and 5 show further embodiments of the invention, the same reference signs being used for the components corresponding to the first embodiment.

The embodiment sketched in FIG. 4 uses the entire passivation layer 14 as thermal stress element 13.3, 13.4. FIG. 5 concerns an embodiment with an index-guided edge emitting laser diode, wherein the waveguide 11 is laterally adjoined by index-guiding layers 20.1 and 20.2 which have a lower refractive index than the waveguide 11. The thermal stress elements 13.5, 13.6 provided according to the invention are incorporated in the index guiding layers 20.1 and 20.2.

Further embodiments of the invention result from the following claims.

The invention claimed is:

1. An edge emitting laser diode comprising:
a semiconductor layer stack whose growth direction defines a vertical direction; and
wherein the semiconductor layer stack comprises an active layer and a waveguide layer;
characterized in that
a thermal stress element is arranged in at least indirect contact with the semiconductor layer stack;
wherein the thermal stress element is configured for generating a thermally induced mechanical stress in the waveguide layer which counteracts the formation of a thermal lens,
wherein the thermal stress element consists of a material with a thermal expansion coefficient $\alpha_{th}$ which is smaller than $0.5*10^{-6}$ K$^{-1}$ in a temperature range from 20° C. to 300° C., and
wherein the thermal stress element is arranged such that it adjoins a region of the waveguide for which, during operation of the laser diode, the greatest temperature gradient is present as a function of the lateral direction.

2. The edge emitting laser diode according to claim 1, wherein the thermal stress element is arranged in the vertical direction above the active layer and/or in a lateral direction perpendicular to the vertical direction next to the active layer in or adjacent to the semiconductor layer stack.

3. The edge emitting laser diode according to claim 1, wherein the thermal stress element consists of a material with a negative thermal expansion coefficient $\alpha_{th}$ in the temperature range from 20° C. to 300° C.

4. The edge emitting laser diode according to claim 1, wherein the thermal stress element contains an oxide compound of zirconium and tungsten.

5. The edge emitting laser diode according to claim 1, wherein the thermal stress element contains aluminum titanate and/or zirconium titanate.

6. The edge emitting laser diode according to claim 1, wherein the thermal stress element is part of a passivation layer of the semiconductor layer stack or is formed by a structured passivation layer.

7. The edge emitting laser diode according to claim 1, wherein the edge emitting laser diode is a broad area laser diode.

8. The edge emitting laser diode according to claim 7, wherein the broad area laser diode comprises an optical resonator having a mirror facet and an exit facet arranged spaced from each other in a longitudinal direction, wherein the longitudinal direction forms an orthogonal tripod with the vertical direction and a lateral direction; and wherein at least in a partial section of the optical resonator the extension of the thermal stress element in the vertical direction and/or in the lateral direction increases with decreasing distance from the exit facet.

9. A method for manufacturing an edge emitting laser diode, comprising:
manufacturing a semiconductor layer stack, wherein the growth direction of the semiconductor layer stack defines a vertical direction; and
wherein an active layer and a waveguide layer are provided in the semiconductor layer stack;
characterized in that
a thermal stress element is arranged such that it adjoins a region of the waveguide for which, during operation of the laser diode, the greatest temperature gradient is present as a function of the lateral direction such that the thermal stress element generates a thermally induced mechanical stress in the waveguide layer during operation of the laser diode, which stress counteracts the formation of a thermal lens,
wherein the thermal stress element is made of a material having a coefficient of thermal expansion $\alpha_{th}$ which is smaller than $0.5*10^{-6}$ K$^{-1}$ in a temperature range from 20° C. to 300° C.

10. The method for manufacturing a laser diode according to claim 9, wherein the thermal stress element is arranged in the vertical direction above the active layer and/or in a lateral direction perpendicular to the vertical direction next to the active layer in or adjacent to the semiconductor layer stack.

11. The method for manufacturing an edge emitting laser diode according to claim 9, wherein the thermal stress element is made of a material having a negative coefficient of thermal expansion $\alpha_{th}$ in the temperature range from 20° C. to 300° C.

* * * * *